United States Patent [19]

Shiba

[11] 4,450,470

[45] May 22, 1984

[54] SEMICONDUCTOR INTEGRATED CIRCUIT DEVICE

[75] Inventor: Hiroshi Shiba, Tokyo, Japan

[73] Assignee: Nippon Electric Co., Ltd., Tokyo, Japan

[21] Appl. No.: 11,582

[22] Filed: Feb. 12, 1979

[30] Foreign Application Priority Data

Feb. 10, 1978 [JP] Japan .................. 53-14251
Feb. 10, 1978 [JP] Japan .................. 53-14252

[51] Int. Cl.³ .............. H01L 27/04; H01L 29/04; H01L 23/52; H01L 27/13
[52] U.S. Cl. .................. 357/59; 357/50; 357/51; 357/67; 357/86
[58] Field of Search .............. 357/59, 50, 67, 51, 357/86

[56] References Cited

U.S. PATENT DOCUMENTS

| | | | |
|---|---|---|---|
| 3,651,385 | 3/1972 | Kobayashi | 357/59 |
| 3,673,471 | 6/1972 | Klein et al. | 357/59 |
| 4,041,522 | 8/1977 | Oguey et al. | 357/42 |
| 4,074,304 | 2/1978 | Shiba | 357/54 |
| 4,109,372 | 8/1978 | Geffken | 357/67 |
| 4,128,845 | 12/1978 | Sakai | 357/34 |
| 4,161,745 | 7/1979 | Slob | 357/59 |
| 4,190,466 | 2/1980 | Bhottacharyya et al. | 357/59 |

FOREIGN PATENT DOCUMENTS

| | | | |
|---|---|---|---|
| 49-96684 | 9/1974 | Japan | 357/59 |
| 51-40866 | 4/1976 | Japan | 357/59 |
| 51-40884 | 4/1976 | Japan | 357/59 |
| 54-25676 | 2/1979 | Japan | 357/59 R |

OTHER PUBLICATIONS

Jaeger, IBM Tech. Discl. Bull., vol. 19, No. 10, Mar. 1977, pp. 3942-3946.
Hamilton et al., Basic IC Engineering, McGraw-Hill, 1975, pp. 4-10.

Primary Examiner—William D. Larkins
Attorney, Agent, or Firm—Sughrue, Mion, Zinn, Macpeak, and Seas

[57] ABSTRACT

An integrated circuit device of large scale integration and a method of manufacturing the same makes possible high density packing of circuit elements by eliminating a great number of very minute contact holes. Instead, a circuit-element connector comprised of a polycrystalline silicon wiring path is formed by selective oxidation. Impurity atoms are introduced into the semiconductor substrate through the polycrystalline silicon circuit-element connector to form a desired circuit element. A layer of high-conductive material is provided on the polycrystalline silicon layer.

1 Claim, 19 Drawing Figures

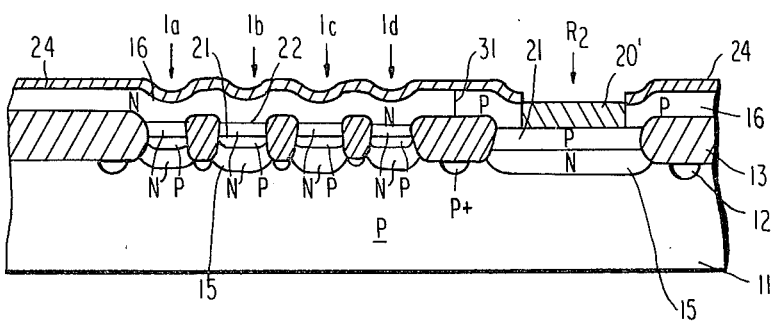
FIG. IIA
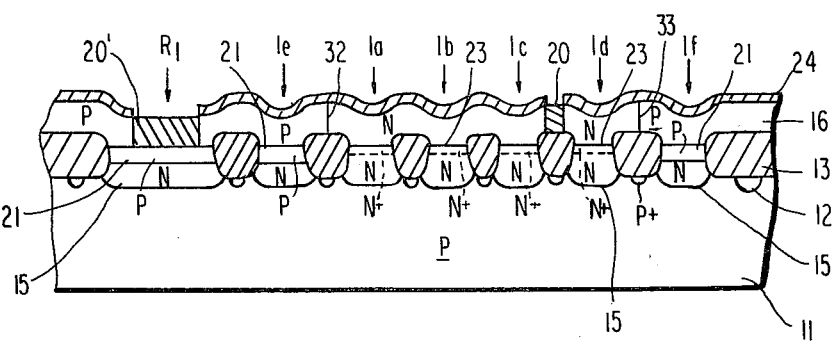
FIG. IIB
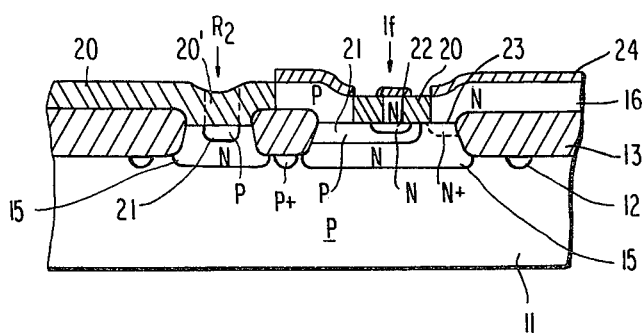
FIG. IIC

SEMICONDUCTOR INTEGRATED CIRCUIT DEVICE

BACKGROUND OF THE INVENTION

This invention relates to an integrated circuit device of large scale integration (LSI) which contains circuit elements poched at a high density, and more particularly, to a large scale semiconductor integrated circuit device using a polycrystalline silicon layer.

As is well known a conventional integrated circuit device contains a plurality of mutually isolated circuit elements in a semiconductor substrate which are interconnected by means of metal wiring paths provided on the surface of the substrate. The circuit elements are connected to the wiring paths through contact holes or openings formed in an insulating layer which covers the circuit elements.

However, manufacturing an integrated circuit device of high density and of large scale integration by such conventional technique for circuit configuration has required a great number of very minute contact holes, which have not been able to be attained without a very advanced technology for processing miniature patterns. Since there is a limit to fineness of a pattern which can be realized, integration beyond a limited scale has been impossible with the conventional technique.

SUMMARY OF THE INVENTION

It is therefore one object of this invention to provide a novel structure of an integrated circuit device adapted for a high density and large scale integration.

It is another object of this invention to provide a novel method of producing an integrated circuit device which is capable of readily manufacturing a high density large-scale integrated circuit.

One major feature of this invention lies in using a circuit-element connector made of polycrystalline silicon which is intersected with a monocrystalline region of the semiconductor substrate and through which impurity atoms are introduced into the intersecting portion of the monocrystalline region to form there a PN junction. Unwanted PN junctions formed in the connector when inpurities of different conductivity types are introduced through the same connector may be shorted by suitable means.

According to another feature of this invention, a circuit-element connector is comprised of a polycrystalline silicon wiring path which is formed by selective oxidization and through which impurity atoms are introduced into the semiconductor substrate to form a desired circuit element.

According to still another feature of this invention, a layer of high-conductive material is provided on the polycrystalline silicon layer formed by selective oxidization, and a circuit element is formed in this polycrystalline silicon layer, which circuit element is defined by an oxide produced by selective oxidization and by the layer of high-conductive material.

Therefore, this invention obviates heretofore required contact holes and thereby remarkably decreases the total number of patterns needed for fabrication of an integrated circuit device. In addition, this invention takes advantage of self-reduction of a pattern, so that a high density integrated circuit device can be readily manufactured without using a sophisticated technology of processing miniature patterns.

BRIEF DESCRIPTION OF THE DRAWINGS

This invention will be better understood by the following description of preferred embodiments thereof with reference to the attached drawings, in which:

FIGS. 2 to 8 represent structures at respective producing steps in manufacture for showing how the circuit of FIG. 1 is constructed according to the first embodiment of this invention: FIG. 3 is a cross-sectional view; FIG. 2B and FIGS. 4B to 8B are plan views; FIG. 2A and FIGS. 4A to 8A are cross-sectional views taken along the respective lines A-A' of FIG. 2B and FIGS. 4B to 8B;

FIG. 11A is a cross sectional view take along the line A-A' of FIG. 10;

FIG. 11B is a cross sectional view taken along the line B-B' of FIG. 10;

FIG. 11C is a cross sectional view taken along the line C-C' of FIG. 10.

DESCRIPTION OF THE PREFERRED EMBODIMENTS

Figure 1:
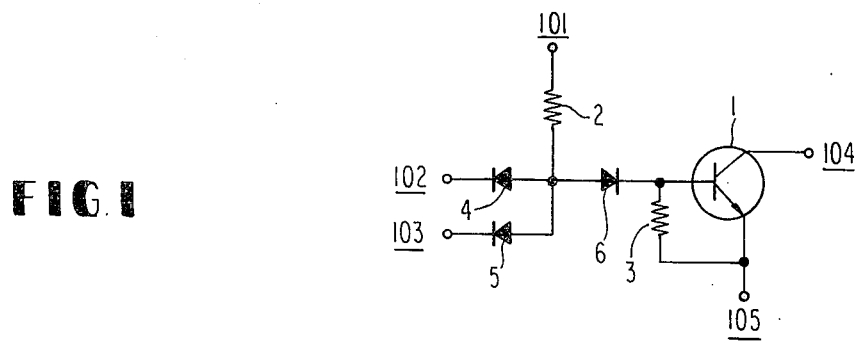
FIG. 1 is an electrical equivalent circuit diagram representing a circuit to be constructed according to a first embodiment of this invention.

Referring to FIGS. 1 to 8, a first embodiment of this invention is described, wherein a gate circuit shown in FIG. 1 by an electrical equivalent circuit diagram is fabricated into an integrated circuit configuration. This gate circuit is composed of a transistor element 1 having a collector connected to an output terminal 104 and an emitter connected to a power supply terminal 105, two resistor elements 2 and 3, resistor element 3 being connected between the base and the emitter of the transistor element 1 and the other resistor element 2 being connected to a power supply terminal 101, and three diode elements 4, 5 and 6, the two diode element 4 and 5 being connected respectively between input terminals 102 and 103 and a common node to which the other terminal of the resistor element 2 is coupled, which the other diode element 6 is connected between the common node and the base of the transistor element 1.

Figure 2A:
Figure 2B:
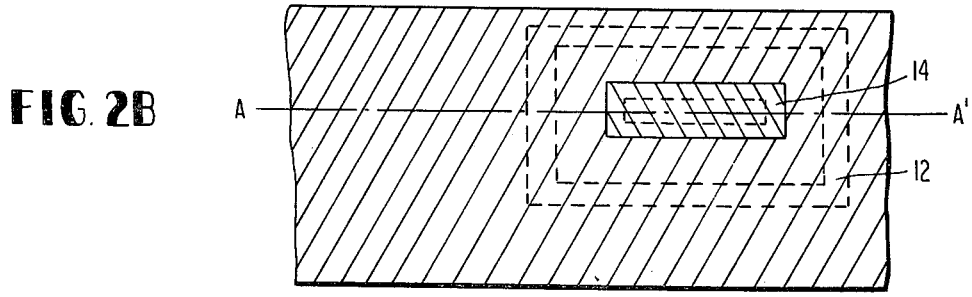
Figure 3:
Figure 4A:
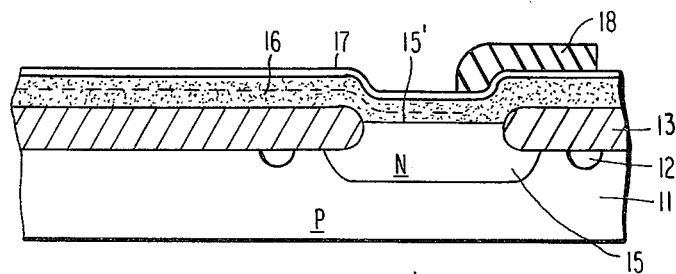
Figure 4B:
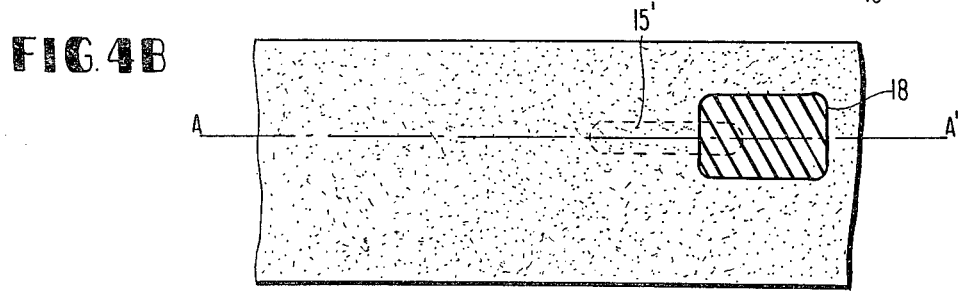

Referring now to FIG. 2, a P-type monocrystalline silicon substrate 11 having a specific resistance of 10 ohms-centimeter is first prepared, and a channel stopper P-type monocrystalline region 12 of high impurity concentration is formed in the surface of the substrate 11 by known selective diffusion using a mask of a silicon oxide layer (not shown) in an annular form so as to encircle an intended transistor area where a transistor element is to be formed. A silicon nitride film 14 is provided on the surface of the intended transistor area, and by using this silicon nitride film 14 as a mask, selective oxidation of the surface of the silicon substrate 11 is carried out. As a result, a silicon oxide layer 13 of about 2 microns thick is formed. The layer 13 is buried in the field area of the semiconductor substrate 11 where no circuit elements are to be formed. As is well known, oxidation of silicon develops also in the lateral direction, and therefore the silicon oxide layer 13 penetrates slightly the intended transistor area under the silicon nitride film 14. Therefore, the area 15 where monocrystalline silicon will be exposed after subsequent removal of the silicon nitride film 14 is smaller than that of the original mask pattern. According to the first embodiment of this invention in which the silicon oxide layer 13 penetrates the intended transistor area by about 1 micron, a slit pattern of 4 microns wide will provide an area where silicon monocrystalline is exposed by a width of about 2 microns. This means that a pattern of the intended transistor area becomes finer than the mask pattern. This phenomenon is referred to in this specification as self-reduction of a pattern. In the next step, N-type impurity atoms are implanted by an ion implantation method over the entire surface of the substrate, and the substrate is subjected to heat treatment. As a result, an N-type monocrystalline region 15 is formed only in the intended transistor area, because the silicon nitride film 14 thereon is far thinner than the silicon oxide layer 13, as shown in FIG. 3. In the first embodiment of this invention which uses a silicon nitride film of 0.1 micron thick and the silicon oxide layer 13 of about 2 microns thick, it is preferred that phosphorous is implanted at an accelerating voltage of 200 KeV at a dose of $4 \times 10^{13}$ and heat treatment is performed in an atmosphere of nitrogen at 1150° C. for 10 hours, which results in an N-type monocrystalline region 15 formed to a depth of about 5 microns and having a sheet resistance of about 300 ohms/square centimeter. As FIG. 4 shows, the silicon nitride layer 14 is removed to expose the surface 15' of the N-type monocrystalline region 15, followed by depositing a layer of polycrystalline silicon 16 over the entire surface to a thickness of 0.5 microns, the surface being thermally oxidized to form a layer of silicon oxide 17 which covers the silicon layer 16 in a thickness of about 0.5 microns. A photoresist 18 is selectively provided so as to cover the intended collector surface region of the N-type region 15 as well as the intended collector lead-out wiring portion of the polycrystalline silicon layer 16. Using the photoresist 18 as a mask, P-type impurity atoms are selectively introduced into the polycrystalline silicon layer 16 by ion implantation. For such ion implantation, it is preferred that boron is implanted at an accelerating voltage of 100 KeV and at a dose of $1 \times 10^{14}$.

Figure 5A:
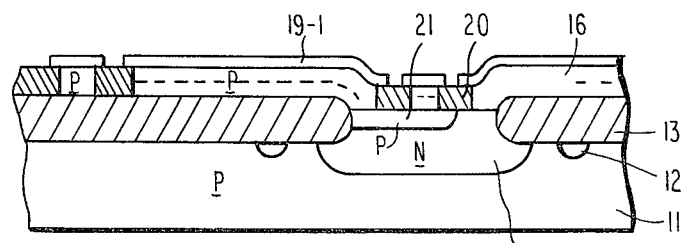
Figure 5B:
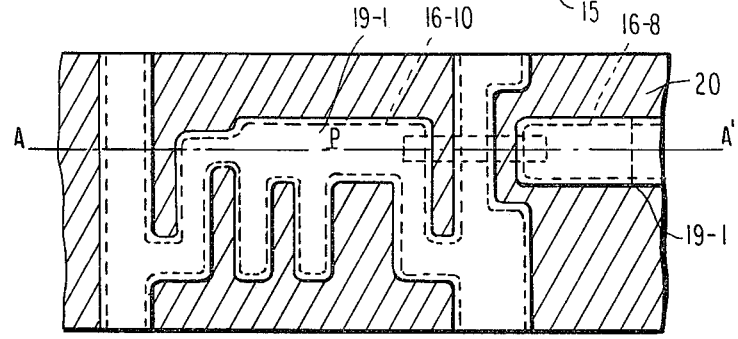

The photoresist layer 18 is then removed and a silicon nitride film is formed over the entire surface of the substrate in a thickness of 0.2 microns. A photoresist is used for selective etching of the silicon nitride film which, as shown in FIG. 5, provides a retained silicon nitride film 19-1 covering only an intended connector portion of the polycrystalline silicon layer 16. The substrate is then subjected to thermal oxidation treatment to selectively convert the exposed portion of the polycrystalline silicon layer 16 into a silicon oxide layer 20, thus forming connectors 16-8 and 16-10 (in this embodiment being described, the connectors 16-8 and 16-10 include one or more of the circuit elements, electrodes connected to each element, and wiring interconnecting the elements) composed of mutually isolated portions of polycrystalline silicon layer. In the first embodiment, the thermal oxidization preferably comprises heat treatment in an oxygen atmosphere at 1000° C. for 6 hours. During the oxidization, boron with which the polycrystalline silicon layer 16 has been selectively doped is activated, so that the polycrystalline silicon layer 16 is given the electrical characteristics of a P-type semiconductor having a sheet resistivity of about 4 hilo-ohms/square centimeter and at the same time a P-type semiconductor region 21 of a depth of about 0.4 microns is formed by diffusion of boron in a portion of the N-type monocrystalline region 15 of the substrate which is contacted with the P-type silicon layer 16. In addition, self-reduction of the area of a pattern that accompanies selective oxidization of the polycrystalline silicon layer makes the width of the pattern of the connectors less than the width of the original mask pattern by about 1 micron.

Figure 6A:
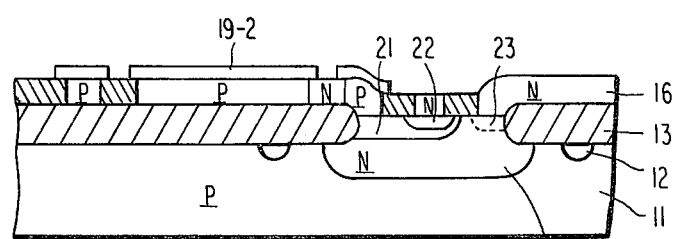
Figure 6B:
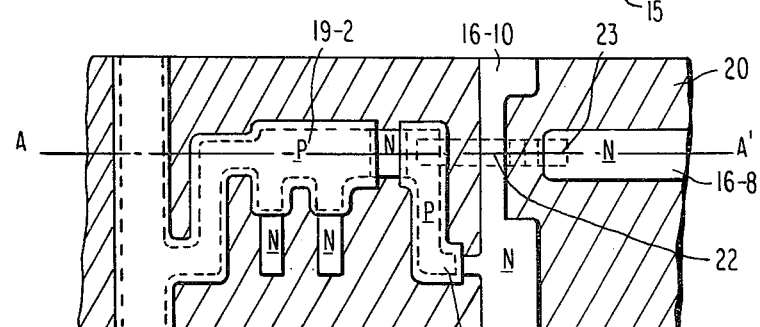

Subsequently, as shown in FIG. 6, such portions of the silicon nitride layer 19-1 that cover intended N-type regions in the respective connectors (in the embodiment being described, including those areas destined for the emitter and collector electrode wirings of a transistor and for diodes) are selectively removed, and the remaining portions of the silicon nitride layer 19-2 are used as a mask for introduction of a high concentration of N-type impurity into the desired portions of the connectors. In the first embodiment of this invention, a known thermal diffusion method is preferrably employed wherein phosphorous is introduced at 950° C. for 20 minutes. During such diffusion process, phosphorous is introduced into the intended N-type regions of the polycrystalline silicon layers to thereby give them the characteristics of about 20 ohms/square centimeter and further to form highly doped N-type monocrystalline regions 22 and 23 to a depth of about 0.4 microns at an intended emitter region in the P-type monocrystalline region 21 and at an intended collector contact region in the N-type monocrystalline region 15 where the N-type polycrystalline portions are contacted with the monocrystalline regions and phosphorous is introduced into the monocrystalline regions.

As a result of the manufacturing processes described hereinabove, an NPN transistor having the N-type monocrystalline region 15, as a collector region, P-type monocrystalline region 21 as a base region, and highly doped N-type monocrystalline region 22 as an emitter region as well as connectors 16-8 and 16-10 made of polycrystalline silicon of P-and/or N-type connected to the respective regions of the transistor are formed.

In the subsequent step, metallization is performed as will be described hereinbelow for the purposes of shorting unwanted PN junctions formed in the connectors and increasing the electrical conductivity of electrode and wiring portions of the connectors other than those portions of the connectors which are intended to be resistors and anode, cathode and PN junction of diodes. As shown in FIG. 7, those portions of the retaining insulating film 19-2 on the connectors which cover the unwanted PN junctions 7-1 and 7-2 and the intended conducting paths 16-1 through 16-8 excepting the intended resistor portions 2 and 3 and the intended diode portions 4, 5 and 6 are removed from the surface of the connector to expose the mentioned portions 7-1, 7-2, 16-1 to 16-8 and to further retain five pieces 19-3 of the silicon nitride layer on the excepting portions 2 to 6 of the silicon layer. Thereafter, a thin layer of metal is deposited on the entire surface of the substrate which is then heat-treated to form a metal silicide 24 on the exposed area of the connectors, followed by removal of the remaining thin metal layer. According to the first embodiment of this invention, a platinum layer of about 0.1 micron thick is deposited and heat treatment is performed in a nitrogen atmosphere at 600° C. for 30 minutes to form a layer of platinum silicide. Following the heat treatment, the substrate is immersed in aqua regia to remove the remaining platinum, leaving on the exposed areas of the connectors a layer of platinum silicide having a sheet resistivity of about 5 ohms/square centimeter. Finally, as shown in FIG. 8, the entire surface of the substrate is coated with an insulating film 25, which is then provided with openings at desired locations deep enough to reach the metal silicide. Therefter, metal layers are selectively formed, such that each metal layer is connected to the metal silicide within the respective openings and extended to the upper surface of the insulating layer 25, to serve as terminals 101 through 105. Since an insulating layer 20 formed by selective oxidation of the silicon layer is positioned on the outside of the connectors, the openings may extend to the outside of the connectors and the diameter of the openings may be larger than the width of the connectors, thus requiring less strict alignment of openings. The metal layers 101 to 105 may be used as lead-out terminals for external connection or as wiring paths interconnecting circuit elements or connected to other circuit elements, or may be replaced by connectors made of the same polycrystalline silicon as used in the connectors in the first layer.

The manufacturing process described above provides a complete gate circuit as shown in FIG. 1 wherein the NPN transistor 1 formed in the monocrystalline region of the substrate, the resistor elements 2, 3 and PN junctions (diodes) 4, 5 and 6 formed in the thin polycrystalline silicon layer are interconnected by means of the metal silicide layer 24, and the terminals 101, 102, 103, 104 and 105 made of the metal layer are connected to the respective metal silicide layers 24. In detail, the transistor element 1 is formed in the monocrystalline mesa portion of the substrate 11 surrounded by the buried field oxide layer 13, and its emitter region or its emitter-base PN junction is formed at such portion of the mesa that is intersected with the polycrystalline silicon connector portion 16-1 by diffusion of impurity through the intersection connector portion 16-1. This connector portion 16-1 provided with the metal silicide layer thereon as a conducting path is extended onto the field oxide 13 and connected to the terminal layer 105 and also to another connector portion 16-2 which also serves as a conducting path and in turn connects to the resistor element 3. This resistor element 3 is a part of the connector but free from the metal silicide to keep a low conductivity. The width of the resistor element in determined by selective oxidation for forming the connector and its length is determined by the metal silicide layers on the conducting path portions of the connector. The other end of the resistor element 3 continues to a conducting path 16-3 with the metal silicide which path is connected to the base region 21 of the transistor 1 and to the N-type cathode region of the diode of which comprises P-N junction formed in the polycrystalline silicon layer and P and N-regions adjacent to and on the opposite sides of this P-N junction. Another conducting path 16-4 is connected to the P-type anode region of the diode 6, to P-type anode regions of the diodes 4 and 5, and to one end of the resistor element 2. N-type cathode regions of the diodes 4 and 5 are connected to conducting paths 16-5 and 16-6 with the respective metal silicide layers, which paths are exposed by a common opening in the insulating film 25 and connected therethrough to the metal terminal layers 102 and 103, respectively. The other end of the resistor element 2 in connected to a conducting path 16-7 of a portion of the polycrystalline silicon connector with the metal silicide layer which is in turn connected to the upper terminal layer 101. The collector 15 of the transistor 1 is connected via a conducting path 16-8 with the metal silicide layer 24 to the terminal layer 104.

Figure 9:
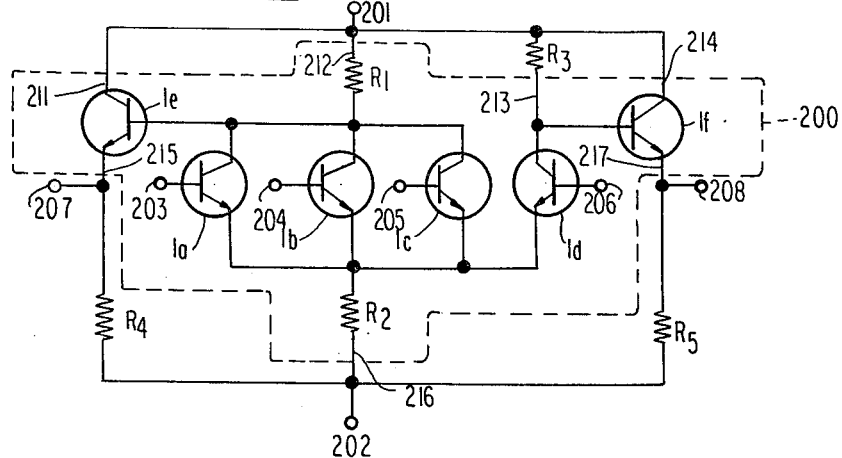
FIG. 9 is an equivalent circuit diagram of an integrated circuit to be constructed according to the second embodiment of this invention.
Figure 10:
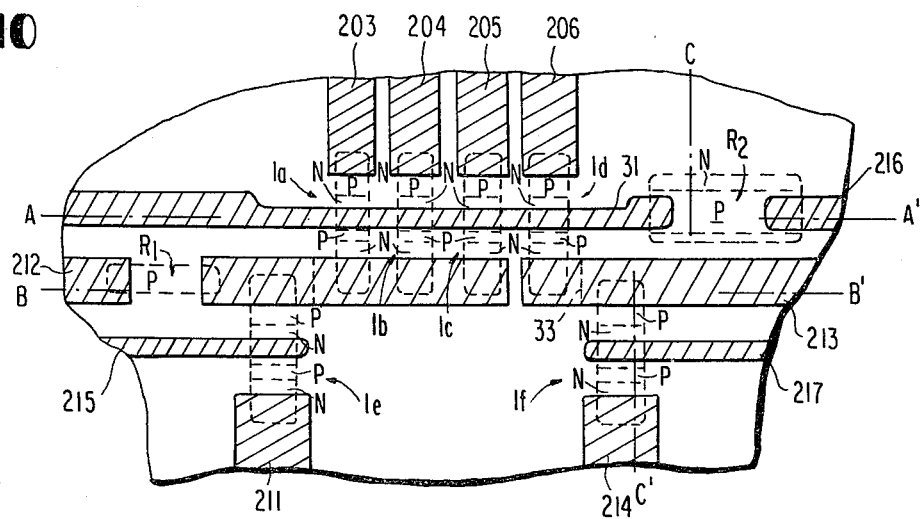
FIG. 10 is a plan view representing part of an integrated circuit device according to the second embodiment of this invention.

The second embodiment of this invention is now described with reference to FIGS. 9 to 11. The embodiment relates to fabrication of a CML gate circuit having an emitter follower as shown in FIG. 9 and suitable for packing into an integrated circuit at high density. The following description with reference to FIG. 10 and 11 is directed to a circuit segment 200 in FIG. 9 comprising transistors 1a to 1f and resistors R1 and R2 for illustrative purpose only. Since optimum arrangement of resistors R1 to R5 (including R1 and R2) and wiring terminals (power terminals 210, 202, input terminals 203 to 205, reference voltage terminal 206, and output terminals 207, 208) may be designed in consideration of connection to other circuits, all of them but resistors R1 and R2 are omitted from FIGS. 10 and 11.

Figure 7A:
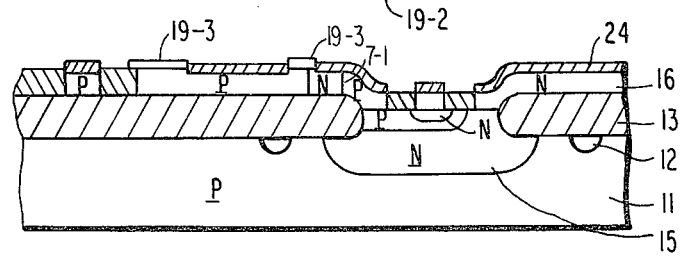
Figure 7B:
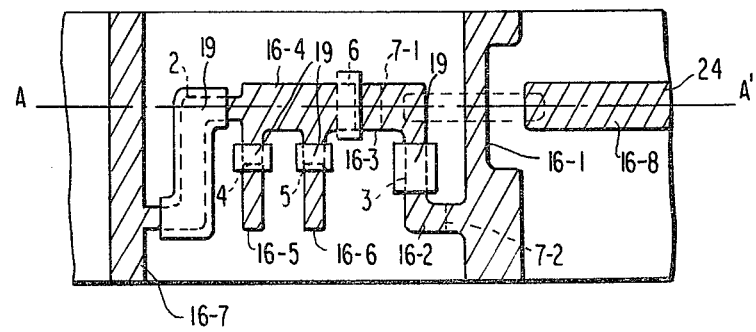
Figure 8A:
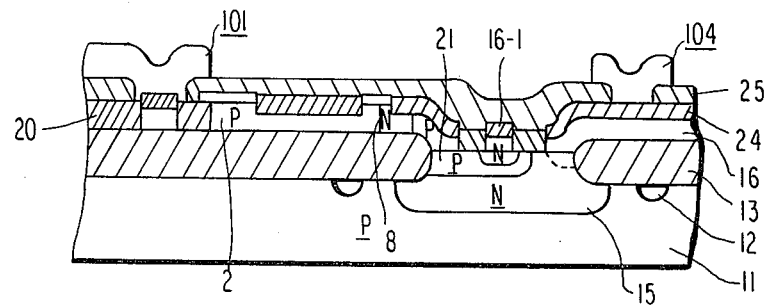
Figure 8B:
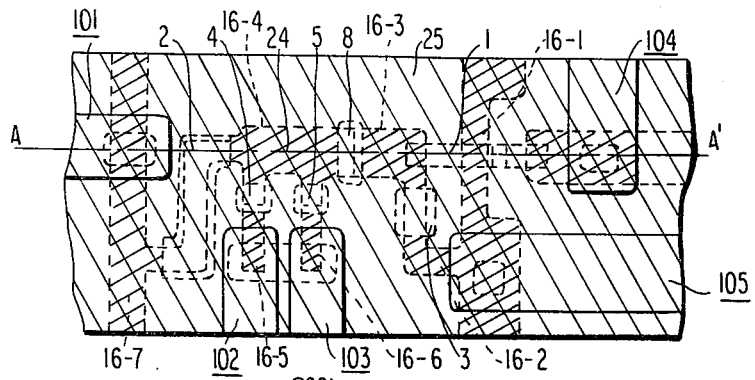

The plan view in FIG. 10 and the cross-sectional views in FIG. 11 each representing an integrated circuit configuration correspond to the plan view of FIG. 7B and cross-sectional view of FIG. 7A, repectively, illustrating the first embodiment of this invention, and same reference numerals are used to identify those parts which are functionally equivalent to the counterparts in the first embodiment. The device of the second embodiment will be fabricated by the same method as in the first embodiment; the surface of P-type semiconductor substrate 11 is subjected to selective oxidation, with those areas destined for transistors 1a to 1f and resistors R1 and R2 being covered with a layer of silicon nitride, to thereby form a layer of oxide 13 which is buried in the substrate so as to surround those areas set aside for individual circuit elements. Prior to selective oxidation, the surface of the substrate is preferably provided with a P-type channel stopper region 12 surrounding these intended areas for circuit elements but provision of such region may be omitted depending on the case. Then, the substrate is doped with an N-type impurity by ion implantation to form an N-type region 15 in the areas intended for circuit elements. Ion implantation may be replaced by a thermal diffusion process, or alternatively, the N-type region 15 may be formed by selective oxidation of a P-type substrate having an N-type epitaxial layer until an oxide is formed which reaches the substrate. The monocrystalline region of the intended area for circuit elements (i.e. the surface of the N-type region 15) is exposed so that the entire surface of the substrate, namely, all of the exposed monocrystalline regions as well as the insulation 13 are covered with a layer of polycrystalline silicon layer 16 which is then doped with a P-type impurity at selected locations. The part of the polycrystalline silicon which is to be doped with the P-type impurity is where it is at least in contact with the portion destined for the bases of transistors 1a to 1f as well as that for resistors R1 and R2, and that part of polycrystalline silicon which is in contact with the latter portion is desirably doped with a lesser amount of the impurity in some areas (which are to be converted to an oxide in a subsequent step). There is no particular limitation on the area to be doped so long as the dopant is not detrimental to subsequent processing. The polycrystalline silicon layer 16 excepting those portions destined for connectors constituting electrode wirings for individual circuit elements is then thermally oxidized to form oxides 20, 20', and at the same time, the N-type monocrystalline region 15 is doped with a P-type impurity through the polycrystalline layer to thereby form P-type regions 21 which function as the base in the area destined for a transistor and as a resistor region in the area destined for a resistor. Part of the polycrystalline silicon layer in contact with the P-type regions 21 and which has been doped with the P-type impurity is also converted to an oxide 20'. Then, an N-type impurity is introduced into the remaining polycrystalline silicon layer and the monocrystalline region in contact therewith, with selected portions of the polycrystalline silicon layer masked. Those portions of the polycrystalline silicon layer which are to be exposed are in contact with the parts set aside for emitters and collector contacts of transistors 1a to 1f. As a consequence, an N-type emitter region 22 is formed in the base region 21 of each transistor, and an N-type collector contact region 23 is formed in the surface region of the collector 15. Subsequently, the polycrystalline silicon layer is plated with a layer 24 of high-conductive material such as metal silicide in order to provide ohmic contact between circuit elements by neglecting unwanted PN junctions 31, 32 and 33 formed in the connector 16. The layer 24 may be disposed only in the neighborhood of each unwanted PN junction, or it need not be provided for a connector free of any unwanted PN junction, but for minimizing a signal loss in the connector, the layer 24 is preferably disposed in all necessary PN junctions of the connector. FIGS. 10 and 11 illustrate the configuration of an integrated circuit being fabricated which has the layer 24 provided in necessary portions; the polycrystalline silicon layer may optionally be covered with a protective film, or it may be insulated with a layer which has openings cut therein for providing necessary electrical connection, or it may be provided with a second wiring layer.

In the resulting circuit configuration shown in FIGS. 10 and 11, four transistors 1a to 1d which have their emitters connected with each other by means of a common connector are arranged side by side, and the polycrystalline silicon connector providing common wiring to the emitters crosses the exposed surface region of each transistor, forming an emitter 22 at the point where the connector crosses each exposed region (also see FIG. 11A). Parallel to these transistors 1a to 1d are disposed emitter follower transistors 1e to 1f, and a connector functioning as a common collector output terminal for the gate transistors 1a to 1c extends across the exposed surface region of each gate transistor and that of the output transistor 1e, to thereby form an N-type collector contact region 23 on the point where the connector crosses each gate transistor, and a P-type base region 21 in the exposed surface region of the output transistor 1e, with the resulting unwanted PN junction 32 being shorted to permit ohmic contact between the common collector output and the base of the output transistor. This is also the case with connection between the collector of the reference transistor 1d and the base of the output transistor 1f (for understanding the above description, also see FIG. 11B). As a result of such circuit arrangement, the dimensions of and distances between the transistors 1a to 1f are reduced to a minimum, thus making fabrication of a high density integrated circuit practically possible. In this connection, the circuit elements shown in FIG. 10 including input terminals 203 to 205 are interconnected as specified in FIG. 9.

The resistor R1 illustrated in the second embodiment of this invention is a semiconductor monocrystalline resistor which has its width defined by the buried oxide layer 13, its length defined by the selectively oxidized layer 20' (stated conversely, the polycrystalline silicon connector on each side) and its depth defined by a depth to which the N-type region 15 is doped with a P-type impurity, whereas the resistor R2 has its width and depth defined by a width and depth to which the N-type region 15 is doped with a P-type impurity, and its length defined by the polycrystalline silicon connector on each side. However, the resistors R1 to R5 may comprise other arrangements such as that of pinch resistor or the same structure as that of the resistor 2 and 3 illustrated in the first embodiment of this invention.

As has been described hereinabove by reference to two of its preferred embodiments, the essential feature of this invention lies in fabricating a circuit by interconnecting individual circuit elements by means of a connector made of polycrystalline silicon; the major advantage of this invention is that it provides high density integration of circuit elements which have their areas reduced by elimination of contact holes conventionally required in interconnection of circuit elements and by taking advantage of the self-reduction of patterns.

Therefore, it should be understood that the technical scope of this invention will by no means be limited by the two embodiments described hereinabove and that it covers all the devices and processes as defined by the appended claims.

What we claim is:

1. An integrated circuit device comprising a semiconductor substrate, an insulating film covering at least a part of one major surface of said substrate, a thin polycrystalline silicon layer formed on said insulating film, said silicon layer having a common portion and first and second branch portions connected at their one ends to said common portion and running in parallel with each other, first, second, and third PN junctions formed in said silicon layer from the upper surface to the bottom of said layer, a highly conductive layer covering the upper surface of said silicon layer except predetermined portions where diodes are to be formed, said first PN junction being located in said common portion and shorted by said highly conductive layer, and said second and third PN junctions being located in said first and second branch portions, respectively, said highly conductive layer being absent at said second and third PN junctions to form diodes there, and means coupled to the respective other ends of said first and second branch portions for applying signals to said diodes formed in said first and second branch portions.

* * * * *

UNITED STATES PATENT AND TRADEMARK OFFICE
CERTIFICATE OF CORRECTION

PATENT NO. : 4,450,470
DATED : May 22, 1984
INVENTOR(S) : Hiroshi Shiba

It is certified that error appears in the above-identified patent and that said Letters Patent is hereby corrected as shown below:

```
Column 1, line 8, change "poched" to --packed--

Column 2, line 46, change "which" to --while--

Column 3, line 34, change "0.5" to --0.05--

Column 3, line 60, change "preferrably" to --preferably--

Column 3, line 67, change "hilo" to --kilo--

Column 4, line 19, change "preferrably" to --preferably--

Column 5, line 45, change "in" to --is--

Column 5, line 64, change "in" to --is--

Column 6, line 13, change "210" to --201--

Column 6, line 27, after "of" insert --a--

Column 7, line 43, change "to" to --and--
```

Signed and Sealed this

Twenty-third Day of April 1985

[SEAL]

*Attest:*

DONALD J. QUIGG

*Attesting Officer*  *Acting Commissioner of Patents and Trademarks*